United States Patent
Tanase et al.

(10) Patent No.: US 7,652,223 B2
(45) Date of Patent: Jan. 26, 2010

(54) ELECTRON BEAM WELDING OF SPUTTERING TARGET TILES

(75) Inventors: Yoshiaki Tanase, San Jose, CA (US); Akihiro Hosokawa, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 708 days.

(21) Appl. No.: 11/245,590

(22) Filed: Oct. 7, 2005

(65) Prior Publication Data

US 2006/0283705 A1    Dec. 21, 2006

Related U.S. Application Data

(60) Provisional application No. 60/689,845, filed on Jun. 13, 2005.

(51) Int. Cl.
*B23K 26/20* (2006.01)
*B23K 15/00* (2006.01)
*B23K 1/20* (2006.01)

(52) U.S. Cl. .......................... 219/121.14; 219/121.64; 228/112.1; 228/258; 204/298.13

(58) Field of Classification Search ............ 219/121.14, 219/121.64; 228/112.1, 258; 204/298.13
See application file for complete search history.

(56) References Cited

U.S. PATENT DOCUMENTS 3,610,872 A * 10/1971 Sciaky .................. 219/121.13
3,926,360 A * 12/1975 Moister, Jr. ............ 228/180.21
4,390,954 A    6/1983 Manning (Continued)

FOREIGN PATENT DOCUMENTS

JP    362136564 A  *  6/1987

(Continued)

OTHER PUBLICATIONS

Official Letter of Pending Patent Application under Examination, issued May 21, 2008, with attached Search Report (TW Patent Application No. 094140672.

(Continued)

*Primary Examiner*—Samuel M Heinrich
(74) *Attorney, Agent, or Firm*—Patterson & Sheridan LLP

(57) ABSTRACT

Embodiments of the invention provide a method of welding sputtering target tiles to form a large sputtering target. Embodiments of a sputtering target assembly with welded sputtering target tiles are also provided. In one embodiment, a method for welding sputtering target tiles in an electron beam welding chamber comprises providing strips or powder of sputtering target material on a pre-determined at least one interfacial line between at least two sputtering target tiles, that are yet to be placed, on a surface of support, placing the at least two sputtering target tiles side by side with edges of the at least two sputtering target tiles abutting and forming at least one interfacial line on top of the strips or powder of sputtering target material, pumping out the gas in the electron beam welding chamber, preheating the at least two sputtering target tiles and the strips or powder of sputtering target material to a pre-heat temperature less than the temperature at which the at least two target tiles begin to melt, undergo a change in physical state, or undergo substantial decomposition, and welding the at least two sputtering target tiles placed side by side into a large sputtering target.

16 Claims, 9 Drawing Sheets

U.S. PATENT DOCUMENTS

| | | | |
|---|---|---|---|
| 4,409,462 A * | 10/1983 | Jahnke | 219/121.14 |
| 4,719,645 A | 1/1988 | Yamabe et al. | |
| 4,790,623 A * | 12/1988 | Winter et al. | 385/109 |
| 4,803,333 A | 2/1989 | Lawrence et al. | |
| 5,149,933 A | 9/1992 | Donner | |
| 5,234,150 A | 8/1993 | Yamamoto et al. | |
| 5,322,463 A | 6/1994 | Young | |
| 5,342,496 A | 8/1994 | Stellrecht | |
| 5,505,365 A * | 4/1996 | Olsen | 228/135 |
| 5,958,157 A | 9/1999 | Crow et al. | |
| 6,074,512 A | 6/2000 | Collins et al. | |
| 6,091,046 A * | 7/2000 | Gilman et al. | 219/121.46 |
| 6,139,679 A | 10/2000 | Satitpunwaycha | |
| 6,199,259 B1 | 3/2001 | Demaray et al. | |
| 6,232,774 B1 | 5/2001 | Kimura | |
| 6,250,933 B1 | 6/2001 | Khoury et al. | |
| 6,255,727 B1 | 7/2001 | Khoury | |
| 6,401,542 B1 | 6/2002 | Kato | |
| 6,423,575 B1 | 7/2002 | Tran et al. | |
| 6,436,802 B1 | 8/2002 | Khoury | |
| 6,545,247 B2 | 4/2003 | Mukasa et al. | |
| 6,556,606 B2 | 4/2003 | Takayama et al. | |
| 6,576,863 B1 | 6/2003 | Piltch et al. | |
| 6,582,572 B2 * | 6/2003 | McLeod | 204/298.12 |
| 6,589,408 B1 | 7/2003 | Wang et al. | |
| 6,698,907 B1 | 3/2004 | Alahautala et al. | |
| 6,750,947 B1 | 6/2004 | Tomita et al. | |
| 6,776,879 B2 | 8/2004 | Yamamoto et al. | |
| 6,784,563 B2 | 8/2004 | Nada | |
| 6,812,471 B2 | 11/2004 | Popiolkowski et al. | |
| 6,849,139 B2 | 2/2005 | Kardokus et al. | |
| 6,849,821 B2 | 2/2005 | Mukasa et al. | |
| 7,550,055 B2 * | 6/2009 | Le et al. | 156/276 |
| 2001/0032388 A1 * | 10/2001 | Morris | 29/852 |
| 2006/0207876 A1 * | 9/2006 | Matsumura et al. | 204/298.13 |
| 2007/0102289 A1 * | 5/2007 | Kato et al. | 204/298.12 |
| 2007/0163120 A1 * | 7/2007 | Okamoto et al. | 29/890.054 |
| 2008/0073411 A1 * | 3/2008 | Matsumura et al. | 228/112.1 |

FOREIGN PATENT DOCUMENTS

| | | | |
|---|---|---|---|
| JP | 363227774 A * | 9/1988 | |
| JP | 01289562 A * | 11/1989 | |
| JP | 404314855 A * | 11/1992 | |
| JP | 406065733 A * | 3/1994 | |
| JP | 02000015462 A * | 1/2000 | |
| JP | 2003-201561 | 2/2003 | |
| JP | 2003129232 A * | 5/2003 | |
| JP | 2003201561 A * | 7/2003 | |
| JP | 2004-204253 A | 7/2004 | |
| JP | 2005015915 A * | 1/2005 | |
| TW | 129334 | 2/1990 | |
| TW | 290487 | 11/1996 | |
| TW | 200506075 A | 2/2005 | |

OTHER PUBLICATIONS

First Office Action for Chinese Patent Application No. 2005101381995 dated Aug. 29, 2008.

Introducing the Largest Electron Beam Welding Machine in the USA! http://www.stadco.com/EBWeldIntro.htm.

Lawrence Kren, "New 'window' of Opportunity for E-beam Welding", www.acceleron-enbeam.com.

Mick Lalley, "Laser Welding", Materials World, vol. 2, pp. 573, Nov. 1994.

MFD Electron Beam Welding: A Brief Introduction to E Beam Welding. http://www-group.slac.stanford.edu/mfd/ebeam.html.

Richard Johnson and Stephan Kallee, "Advantages of Friction Welding", Materials World, vol. 7, No. 12, pp. 751-753, Dec. 1999.

TWI Knowledge Summary, "Electron Beam Welding—Equipment", Copyright 2000, TWI Ltd.

Univeristy of Cambridge, "Friction Stir Welding", Joining of Commerical Aluminum Alloys, (INCAL 2003).

U.S. Appl. No. 10/888,383, filed Jul. 9, 2004.

* cited by examiner

ELECTRON BEAM WELDING OF SPUTTERING TARGET TILES

CROSS-REFERENCE TO RELATED APPLICATIONS

This application claims benefit of U.S. provisional patent application Ser. No. 60/689,845, filed Jun. 13, 2005, which is herein incorporated by reference.

BACKGROUND OF THE INVENTION

1. Field of the Invention

Embodiments of the present invention generally relate to substrate processing apparatuses and methods, such as apparatuses and methods for flat panel display processing (i.e. LCD, OLED, and other types of flat panel displays), semiconductor wafer processing, and solar panel processing. In particular, the embodiments of the invention relate to sputtering target for large area substrate processing systems.

2. Description of the Related Art

Physical vapor deposition (PVD) is one of the most commonly used processes in fabrication of electronic devices, such as flat panel displays. PVD is a plasma process performed in a vacuum chamber where a negatively biased target is exposed to a plasma of an inert gas having relatively heavy atoms (e.g., argon) or a gas mixture comprising such inert gas. Bombardment (or sputtering) of the target by ions of the inert gas results in ejection of atoms of the target material. The ejected atoms accumulate as a deposited film on a substrate placed on a substrate pedestal disposed underneath the target within the chamber. Flat panel display sputtering is principally distinguished from the long developed technology of wafer sputtering by the large size of the substrates and their rectangular shape.

FIG. 1 (prior art) shows a typical DC magnetron PVD reactor 10, which includes an electrically grounded vacuum chamber 12 to which a target 14 is vacuum sealed through an electrical isolator 16. A DC power supply 18 negatively biases the target 14 with respect to the chamber 12 to excite an argon sputter working gas into a plasma. However, it is noted that RF sputtering is also known. The positively charged argon ions are attracted to the biased target 14 and sputter material from the target 14 onto a substrate 20 supported on a pedestal in opposition to the target 14. A magnetron 24 positioned in back of the target projects a magnetic field parallel to the front face of the target 14 to trap electrons, thereby increasing the density of the plasma and increasing the sputtering rate. In modern sputter reactors, the magnetron may be smaller and be scanned about the back of the target 14. Even a large magnetron may be scanned in order to improve the uniformity of erosion and deposition. Aluminum, titanium, and copper targets are typically formed of a sputtering layer of the material to be sputtered coated onto or bonded to a target backing plate of less expensive and more readily machine-able material.

Sputter reactors were largely developed for sputtering onto substantially circular silicon wafers. Over the years, the size of silicon wafers has increased in diameter from 50 mm to 300 mm. Sputtering targets need to be somewhat larger than the wafers to provide more uniform deposition across the wafer. Typically, wafer sputter targets are formed of a single circular member for some materials such as aluminum and copper or a single continuous sputter layer formed on a backing plate for more difficult materials.

In the early 1990's, sputter reactors were developed for thin film transistor (TFT) circuits formed on glass panels to be used for large displays, such as liquid crystal displays (LCDs) for use as computer monitors or television screens. The technology was later applied to other types of displays, such as plasma displays and organic semiconductors, and on other panel compositions, such as plastic and polymer. Some of the early reactors were designed for panels having a size of about 400 mm×600 mm. Because of the increasing sizes of flat panel displays being produced and the economy of scale realized when multiple displays are fabricated on a single glass panel and thereafter diced, the size of the panels has been continually increasing. Flat panel fabrication equipment is commercially available for sputtering onto panels having a minimum size of 1.8 meter and equipment is being contemplated for panels having sizes of 2 m×2 m and even larger. One drawback of a single-piece target is the price of the target as the size of the target increases. Bonding multiple tiles of sputtering materials to a single target backing plate is an economical alternative.

Combining sputtering target tiles to create a larger sputtering target without gaps raises many challenges. Therefore, a need exists in the art for a method of combining sputtering target tiles to create large sputtering target for large area substrate processing systems.

SUMMARY OF THE INVENTION

Embodiments of a method of welding sputtering target tiles together before they are bonded to a backing plate are provided. Embodiments of a sputtering target assembly with welded sputtering target tiles are also provided. In one embodiment, a method for welding sputtering target tiles comprises placing at least two sputtering target tiles side by side on a surface of support with edges of the at least two sputtering target tiles abutting and forming at least one interfacial line, and welding the at least two sputtering target tiles placed side by side into a sputtering target.

In another embodiment, a method for welding sputtering target tiles in an electron beam welding chamber comprises providing strips or powder of sputtering target material on a pre-determined at least one interfacial line between at least two sputtering target tiles, that are yet to be placed, on a surface of support, placing the at least two sputtering target tiles side by side with edges of the at least two sputtering target tiles abutting and forming at least one interfacial line on top of the strips or powder of sputtering target material, pumping out the gas in the electron beam welding chamber, preheating the at least two sputtering target tiles and the strips or powder of sputtering target material to a pre-heat temperature less than the temperature at which the at least two target tiles begin to melt, undergo a change in physical state, or undergo substantial decomposition, and welding the at least two sputtering target tiles placed side by side into a large sputtering target.

In another embodiment, a sputtering target comprises one sputtering target with sputtering surface area greater than 10,000 cm$^2$, wherein the sputtering target is made by welding together at least two sputtering target tiles placed side by side together.

In yet another embodiment, a sputtering target assembly comprises one sputtering target with sputtering surface area greater than 10,000 cm$^2$, wherein the sputtering target is made by welding together at least two sputtering target tiles placed side by side together, and a backing plate bonded to the sputtering target.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 2:
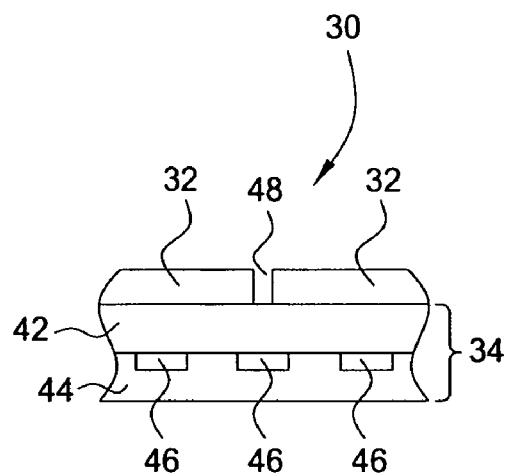
FIG. 2 is a cross-sectional view of a configuration of target tiles bonded to a target backing including cooling channels.

For large sputtering targets, a two-dimensional tile arrangement is sometimes necessary. Rectangular target tiles are arranged in a rectangular array and bonded to a target backing plate. The tile size depends on a number of factors, including ease of fabricating the tiles, and they may number 3×1, 3×3, 4×5 or other applicable combinations. The tiles may be of substantial size, for example 750 mm×900 mm, such that a 3×3 array is required for a larger panel. The number of tiles in the tile array may be even greater if the target material is difficult to work with, such as chromium or molybdenum. The target backing plate is generally rectangularly shaped to conform to the shape and size of the panel being sputter coated but its corners are typically rounded to conform to the chamber body supporting it and it could include an extension from the chamber body containing an electrical terminal for powering the target and pipe couplings for the cooling fluid used to cool the target. As illustrated in an exemplary cross section in FIG. 2, the target backing plate 34 for flat panel sputtering is typically formed from two metal plates 42, 44, for example, of titanium welded or otherwise bonded together. One of the plates 42, 44 is formed with linear cooling channels 46 through which the cooling fluid circulates. This backing plate 34 is more complex than the usual backing plate for wafer processing since, for the very large panel size, it is desired to provide a backside vacuum chamber rather than the usual cooling bath so as to minimize the differential pressure across the very large target 30.

The tiles 32 are bonded to the backing plate 34 on its chamber side with a gap 48 possibly formed between the tiles 32. Typically, the tiles 32 have a parallelopiped shape with perpendicular corners with the possible exception of beveled edges at the periphery of the tile array. The gap 48 is intended to satisfy fabricational variations and thermal expansion of tiles and may be between 0 and 0.5 mm. Neighboring tiles 32 may directly abut but should not force each other. On the other hand, the width of the gap 48 should be no more than the plasma dark space, which generally corresponds to the plasma sheath thickness and is generally slightly greater than about 0.5 mm for the usual pressures of argon working gas. Plasmas cannot form in spaces having minimum distances of less than the plasma dark space. As a result, the underlying titanium backing plate 34 is not sputtered while the tiles 32 are being sputtered.

Figure 1:
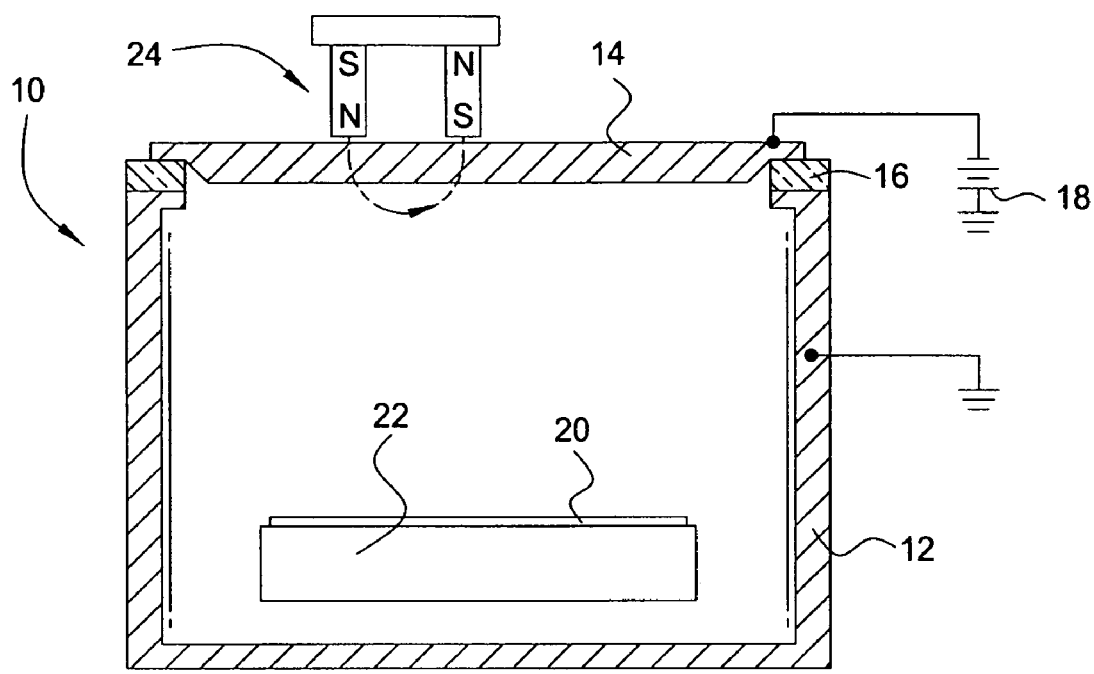
FIG. 1 (prior art) is a schematic cross-sectional view of a conventional plasma sputter reactor.

The tiles 32 are arranged within a rectangular outline conforming approximately to the area of the target 30 desired to be sputtered or somewhat greater. The magnetron 24 of FIG. 1 is scanned within this outline. Shields or other means are used to prevent the un-tiled surface of the backing plate 34 from being exposed to high-density plasma and be thereby sputtered. Clearly sputtering a backing plate 34, made of material such as titanium, supporting molybdenum or other tiles is not desired. Even if the backing plate 34 is composed of the same material as the target tiles 32, sputtering of the backing plate 34 is not desired. The backing plate 34 is a complex structure and it is desired to refurbish it after one set of tiles 32 have been exhausted and to use it for a fresh set of tiles 32. Any sputtering of the backing plate 34 should be avoided.

Figure 3:
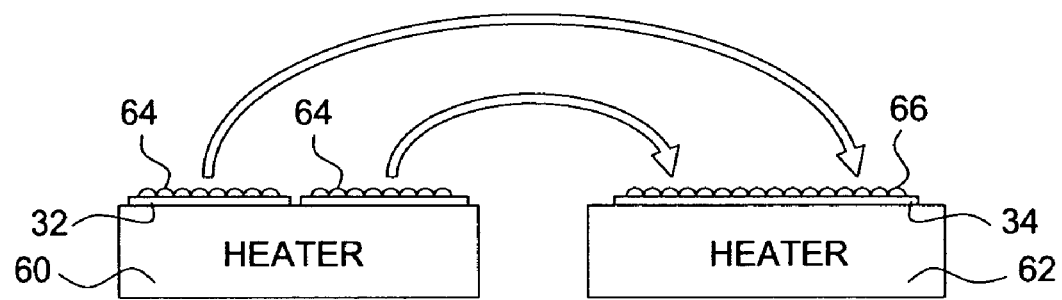
FIG. 3 is a schematic view illustrating a conventional method of bonding target tiles to a backing plate.

There are several processes and bonding materials available for bonding target tiles to the backing plates. One process illustrated in FIG. 3 includes an apparatus comprising two heating tables 60, 62. The tiles 32 are placed on one table 60 with their sputtering face oriented downwards. Each tile 32 is painted on its backside with an adhesive coating 64, such as indium. The heating table 60 heats the coated tiles 32 to about 200° C., far above indium's melting point of 156° C. so that indium wets to the tiles 32 and forms a uniform molten layer. Similarly, the backing plate 34 is placed on the other heating table 62 and is painted with an indium coating 66 and is heated to about 200° C. With all indium coatings 64, 66 in their molten state, the tiles 32 are removed from the first table 60, inverted, and placed on top of the backing plate 34 with the melted indium coatings 64, 66 facing each other and the sputtering faces oriented upwards. Upon cooling, the indium solidifies and bonds the tiles 32 to the backing plate 34.

The transfer operation must be performed quickly enough that the indium coating 64 on the tiles 32 does not solidify during transfer. For smaller targets, the transferring could be done manually. However, with the target and tiles becoming increasingly larger, a transfer fixture grasps the edges of the tiles, and a crane lifts the fixture and moves it to the second table. In addition to indium, other adhesives, such as elastomeric adhesive, can also be used to bond sputtering target to the backing plate.

Figure 4:
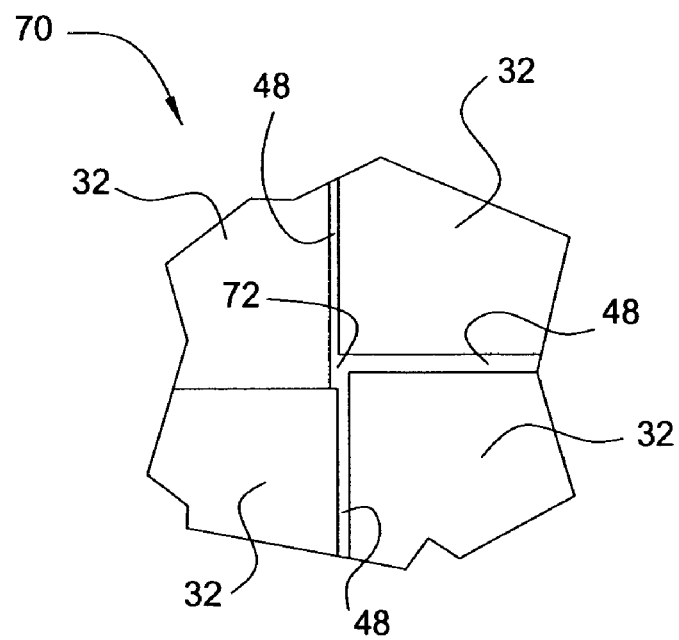
FIG. 4 is a plan view of a corner area between four tiles.

Such large mechanical structures are not easily manipulated to provide the desired degree of alignment, specifically, the bonded tiles being separated by no more than 0.5 mm. Instead, as illustrated for a corner area 70 between four tiles 32 in the plan view of FIG. 4, the four tiles 32 arranged in a rectangular array tend to slide along each other and be misaligned with different sizes for the inter-tile gaps 48. More importantly, an interstix 72 between the corners of the four tiles may become much larger than intended. An interstix is meant a point or space at the interfaces between three or more tiles so that the term does not include the line between two tiles. Even a well defined interstix 72 presents the greatest gap between tiles 32. As a result, the widest point of the interstix 72 for misaligned tiles 32 may become larger than the plasma dark space, e.g., 1 mm, so that the plasma may propagate towards the backing plate 34. If the gap is only slight larger than the plasma dark space, the plasma state in the gap may be unsteady and result in intermittent arcing and backing plate sputtering. Even if the arcing is confined to tile material, the arc is likely to ablate particles of the target material rather than atoms and create contaminant particles. If the plasma reaches the backing plate, the backing plate will be sputtered. Plate sputtering will introduce material contamination if the tiles and backing plate are of different materials. Furthermore, plate sputtering will make it difficult to reuse the backing plate for a refurbished target. Even if the plasma does not immediately reach the backing plate, an oversized interstix 72 allows the plasma to sputter the sides of the tiles 32 facing the interstix 72. The side sputtering will further enlarge the interstix 72 and worsen the situation of plate sputtering. Therefore, there is a need of a method of reducing the gap 48 and interstix 72.

Embodiments provide a method of welding sputtering target tiles to create a large sputtering target to eliminate the inter-tile gaps and the interstixes. The concept of the invention can be applied to weld all sizes of sputtering targets or target tiles used for processing any type of substrates. The concept of the invention can be applied to targets with sputtering surface area greater than 750 cm². Typically, the concept of the invention is applied to targets with sputtering surface greater than 10,000 cm², when single-piece sputtering target is too expensive. The target could be made of any type of sputtering materials, such as aluminum, copper, gold, nickel, tin, molybdenum, chromium, zinc, palladium, stainless steel, palladium alloys, tin alloy, aluminum alloy, copper alloy, and indium tin oxide (ITO). An example of target material for manufacturing of flat panel displays is molybdenum. The sputtering target tiles are welded together before being bonded to the backing plate.

There are several welding techniques to weld metal piece to metal piece, such as electron beam welding (EBW), laser welding (LW), or friction stir welding (FSW). Electron beam welding and laser welding both are non-contact welding processes for joining metals that uses highly focused beams of electrons or laser as heat sources. The high power densities of the electron or laser beams cause almost instantaneous local melting of the work piece materials. Both the electron and laser beams make "keyholes" in the welding areas and the liquid metals solidify behind the traversing beams, leaving very narrow welds and heat affected zones (HAZ).

Electron beams for welding are normally generated in a relatively high vacuum (lower than $5\times10^{-5}$ mbar), but the work piece(s) can be housed in a chamber maintained at a coarser vacuum level, e.g. $5\times10^{-3}$ mbar. It is also possible to project high power electron beams into the atmosphere and produce single pass welds, but the weld width is typically greater than welds made in vacuum. Usually, the electrons are extracted from a hot cathode, accelerated by a high potential—typically 30,000 to 200,000 volts, and magnetically focused into a spot with a power density of the order of 30,000 W/mm². This causes almost instantaneous local melting and vaporization of the work piece material. For example, if the sputtering target material is molybdenum, whose melting temperature of molybdenum is 2617° C., the welding location where the electron beam or laser beam hit should reach temperature close to or above 2617° C. The electron beam diameter for high vacuum electron beam welding is between about 0.5 mm to about 0.75 mm. The electron beam is thus able to establish a "keyhole" delivering heat, deep into the material being welded. This produces a characteristically narrow, near parallel, fusion zone allowing plane abutting edges to be welded in a single pass. Multiple passes of electron beams can also be applied on the abutting edges to weld work pieces together.

Laser welding is typically conducted in a non-vacuum environment. Laser welding (LW) typically directs laser power in excess of $10^3$ to $10^5$ W/mm² on the surface of the parts to be welded.

Friction stir welding (FSW) involves joining of metals with mechanical welding device contacting the work pieces. The welds are created by the combined action of friction heating and mechanical deformation due to a rotating tool. The maximum temperature reached in the joining area is of the order of 0.8 of the melting temperature of the work piece material. Since FSW involves mechanical welding device contacting the work pieces, pieces of the mechanical welding device could fall off the device and be buried in the welded tiles.

Figure 5A:
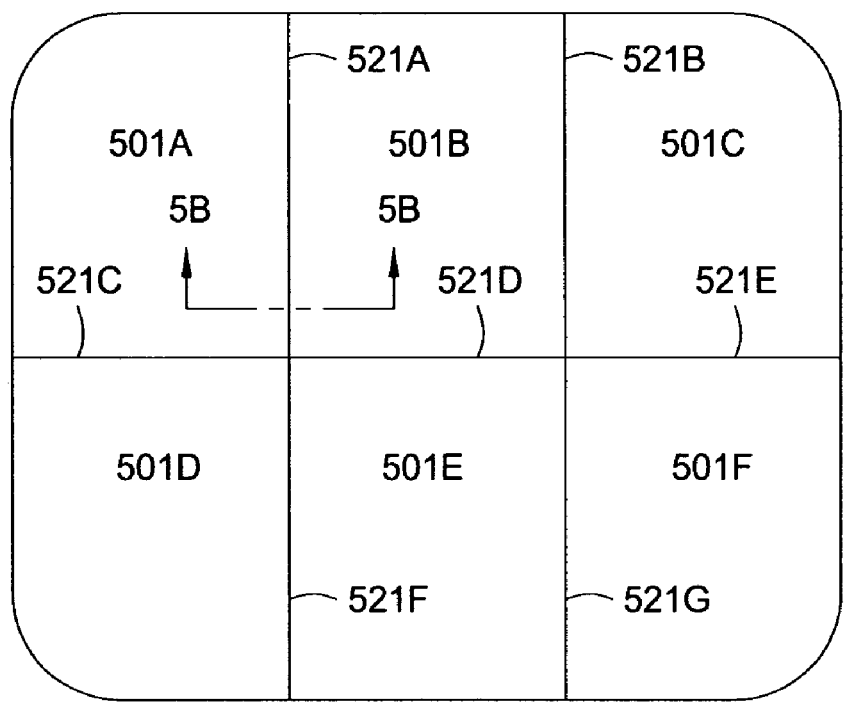
FIG. 5A is a plan view of one embodiment of the current invention with six sputtering target tiles placed side by side.
Figure 5B:
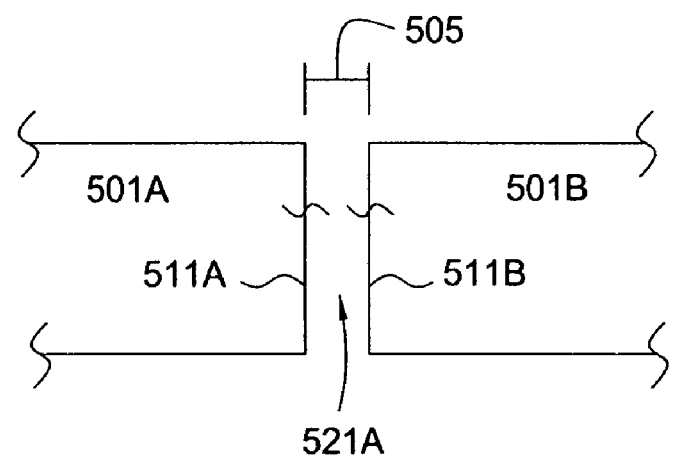
FIG. 5B is a cross-sectional view showing interfacial gap between two sputtering target tiles placed side by side.
Figure 5C:
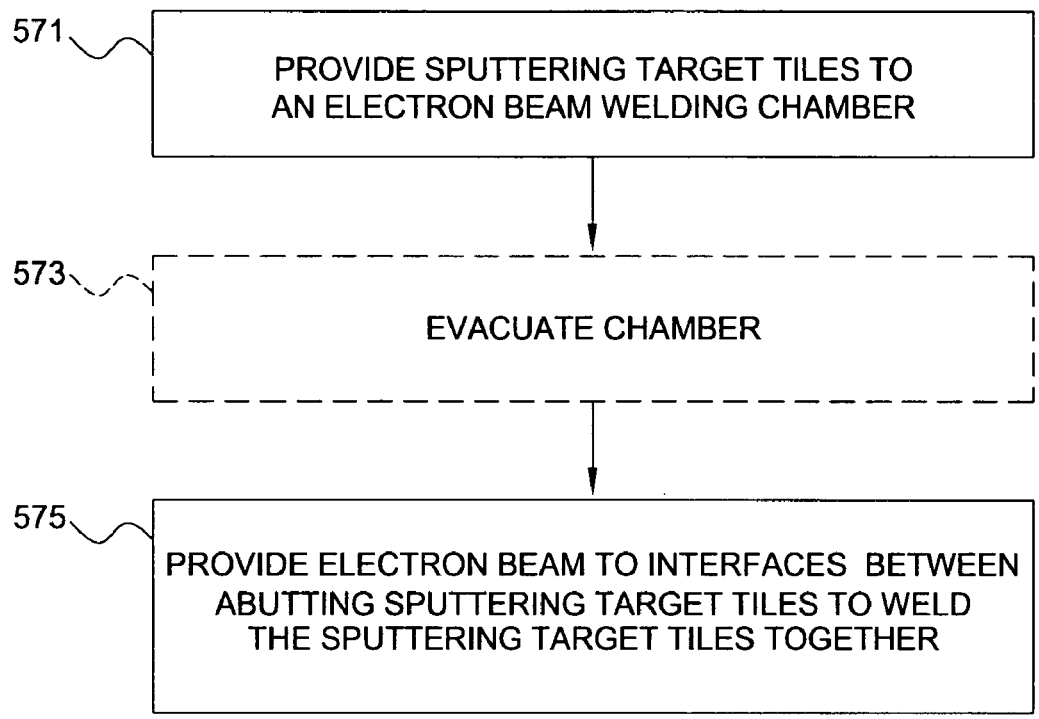
FIG. 5C shows one embodiment of a process flow for welding sputtering target tiles.

FIG. 5A shows an embodiment of the current invention with six sputtering target tiles 501A, 501B, 501C, 501D, 501E, 501F placed side by side. The cross section of tiles 501A and 501B are shown in FIG. 5B. The sidewall of tile 501A is 511A and the sidewall of tile 501B is 511B. The abutting sputtering target tiles 501A, 501B, 501C, 501D, 501E, 501F form interfacial lines 521A, 521B, 521C, 521D, 521E, 521F, 521G. The interfacial lines 521A, 521B, 521C, 521D, 521E, 521F, 521G could have varying gaps sizes along the lines, depending on how smooth or precise the edges of the tiles. The gap spacing 505 of the interfacial line 521A is less than 0.5 mm, and preferably less than 0.05 mm. The gap spacing 505 between tiles 501A and 501B could vary along the interfacial line 521A. If the gap spacing between the abutting tiles is too large, the electron beam welding will either result in no fusion or result in bad welds that have large porosity. In one embodiment of the invention, the sputtering target tiles 501A, 501B, 501C, 501D, 501E, 501F are welded together by electron beam welding. FIG. 5C shows the welding process flow. The process starts by providing sputtering target tiles to an electron beam welding chamber at step 571. The sputtering target tiles should be placed closely together, with spacing 505 (or gaps) between abutting tiles less than 0.5 mm, and preferably less than 0.05 mm. Afterwards, the process chamber is optionally evacuated at step 573, depending on the electron beam welding technology chosen. At step 575, electron beam is provided to interfaces between the abutting sputtering target tiles to weld the sputtering target tiles together.

Figure 5D:
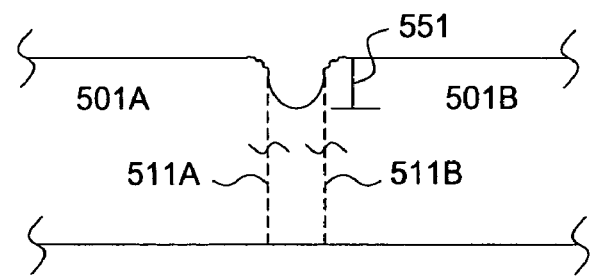
FIG. 5D is a cross-sectional view showing a dips between the interfacial gap between two sputtering target tiles.

FIG. 5D shows a schematic cross-section of electron beam welded tiles of FIG. 5B with an 1 mm to 2 mm dip 551 between two abutting molybdenum sputtering tiles, when the two molybdenum sputtering tiles, originally 0.05 mm apart, are welded at electron beam current of 100 am, electron acceleration voltage of 50 kV, electron beam feed speed of 30 imp (inch per minute), and under chamber pressure roughly of $10^{-5}$ Torr (or at pressure less than $10^{-4}$ Torr). The electron beam tool is made by Squeaky of Chicago, Ill., and the electron beam welding system is made by Stucco of Los Angeles, Calif. Although the bottom portions of the interfaces 511A, 511B are welded (or fused) together, the top portions of the interfaces 511A, 511B are still separated. The 1 mm to 2 mm dip 551 is caused by some of the electron-beam melted molybdenum flowing to the backside of the sputtering target tiles.

To eliminate the dip between 501A and 501B, strips or powder of sputtering target material (or back-fill sputtering target material) can be placed under the interfacial lines between the abutting sputtering target tiles so that sufficient sputtering target materials remain to fill the gaps between the abutting sputtering target tiles. The reduction of sputtering material flowing through the gaps to the backside is achieved by having the strips or powder of sputtering target materials as "stoppers" below and between the gaps or interstixes of sputtering target tiles. The width of the strips or powder of sputtering target material (or back-fill sputtering target material) should be wider than the widest gap spacing of the interfacial lines.

In addition, experimental results show that pre-heating improves the quality of electron beam welding and reduces the chance of cracking in the welding seams. Pre-heating the sputtering target tiles and back-fill sputtering target material seems to reduce the amount of thermal expansion mismatch between the weld and heat-affected zones incurred during and after welding process, which could cause the weld to crack. The pre-heat temperature is generally dependent upon the materials the target tiles are constructed from. For example, the tiles may be heated to a pre-heat temperature less than the temperature at which target tiles begin to melt, undergo a change in physical state or undergo substantial decomposition.

Figure 5E:
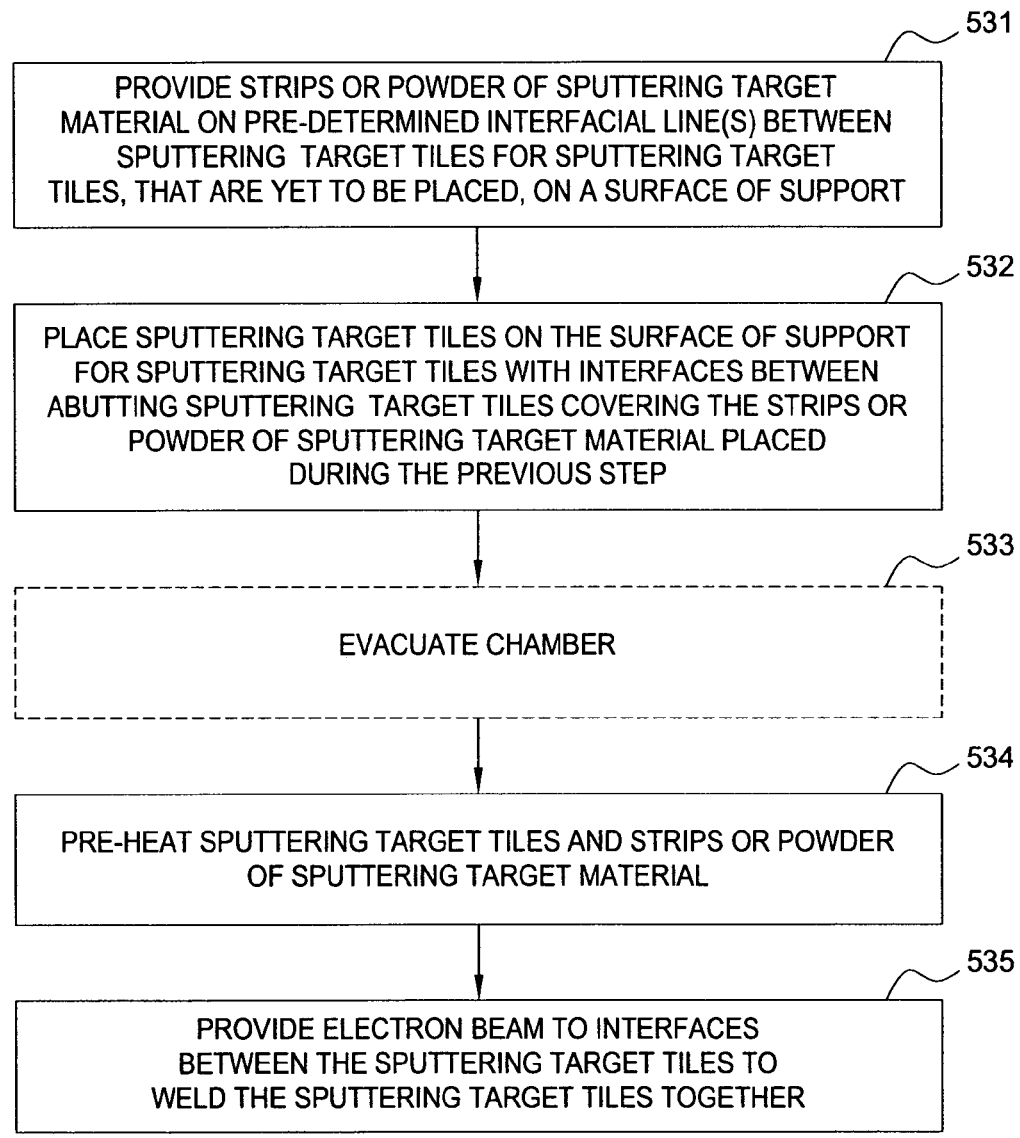
FIG. 5E shows another embodiment of a process flow for welding sputtering target tiles.
Figure 5F:
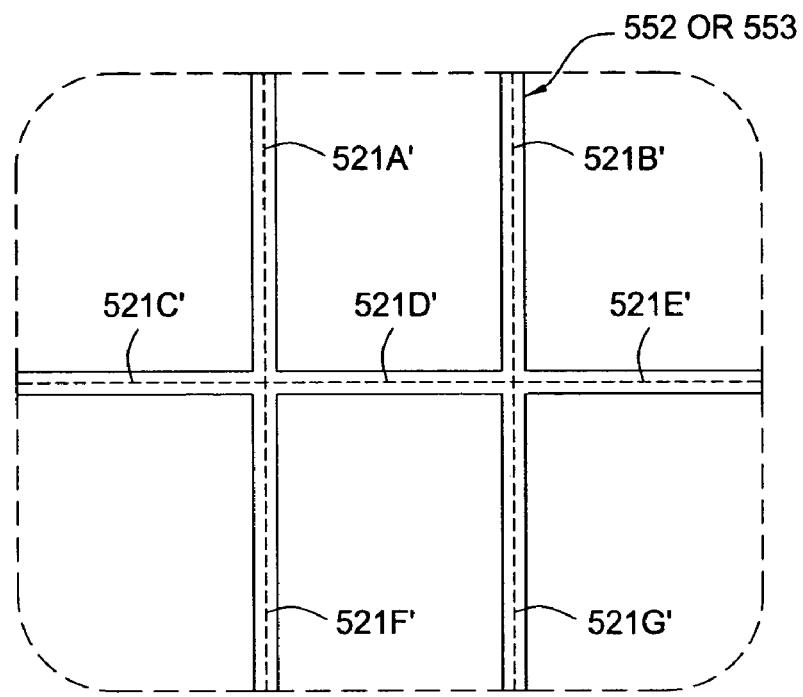
FIG. 5F shows a plan view of strips or powder placed on the pre-determined interfacial lines.
Figure 5G:
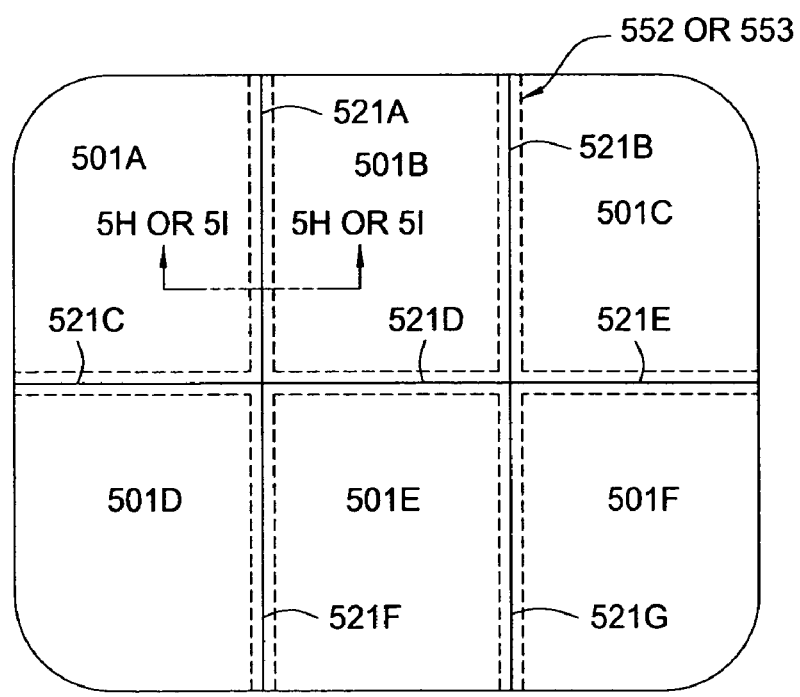
FIG. 5G shows a plan view of six sputtering target tiles placed over the back-fill strips or powder.

FIG. 5E shows an embodiment of a process flow of using strips or powder of sputtering target material under the interfaces between the abutting sputtering target tiles, such as 501A, 501B, 501C, 501D, 501E, 501F in FIG. 5A, and pre-heating the sputtering target tiles and the back-fill sputtering target materials before the welding process. The process starts at step 531 by providing strips 552 or powder 553 of sputtering target material over pre-determined interfacial lines 521A', 521B', 521C', 521D', 521E', 521F', 521G' (dotted lines in FIG. 5F) between sputtering target tiles, such as 501A, 501B, 501C, 501D, 501E, and 501F, which are yet to be placed, on a surface of support for sputtering target tiles (as shown in FIG. 5F). At the following step 532, the sputtering target tiles, such as 501A, 501B, 501C, 501D, 501E, and 501F, are placed on the surface of support, with interfaces between the abutting sputtering target tiles coving the strips or power of sputtering target materials that are already placed during the previous step 531. FIG. 5G shows the plan view of sputtering target tiles 501A, 501B, 501C, 501D, 501E, 501F placed over the strips 552 or powder 553 (shown by dotted lines between sputtering target tiles 501A, 501B, 501C, 501D, 501E, 501F in FIG. 5G). The sputtering target tiles 501A, 501B, 501C, 501D, 501E, 501F form interfacial lines 521A, 521B, 521C, 521D, 521E, 521F, 521G (shown as solid lines in FIG. 5G).

Figure 5H:
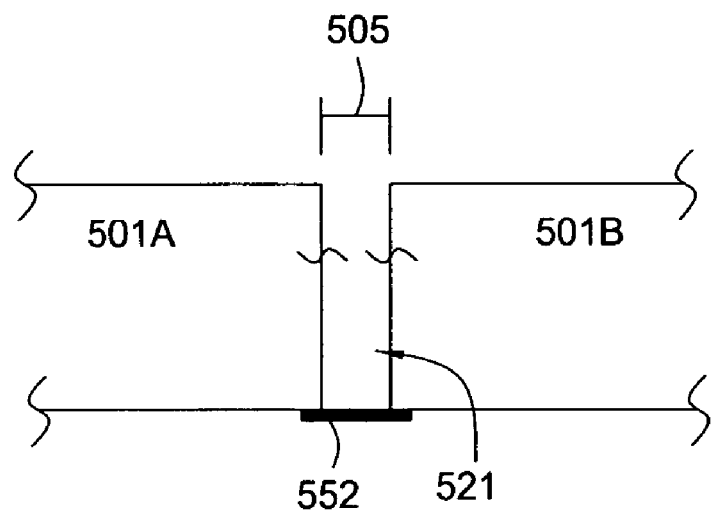
FIG. 5H shows a cross-sectional view of target tiles 501A and 501B placed over back-fill strips.
Figure 5I:
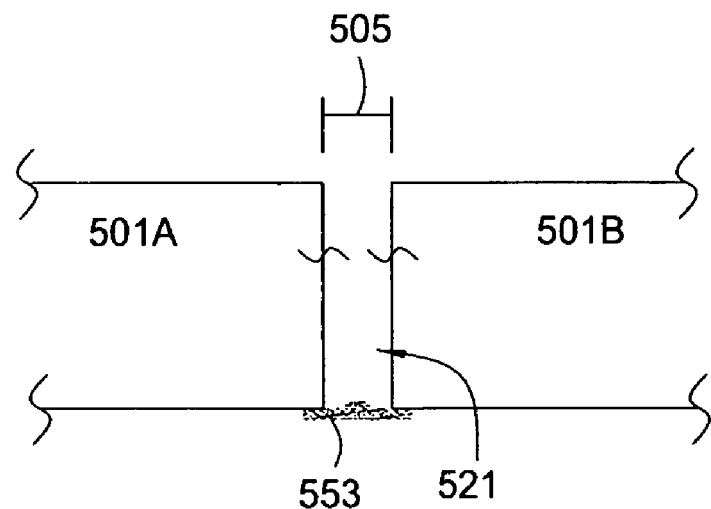
FIG. 5I shows a cross-sectional view of target tiles 501A and 501B placed over back-fill powder.

The sputtering target tiles are placed closely together, with spacing 505 between the abutting target tiles less than 0.5 mm, and preferably less than 0.05 mm. FIG. 5H shows a cross-sectional view of the spacing 505 between tiles 501A and 501B with the back-fill strips 552 under the interfacial line 521. FIG. 5I shows a cross-sectional view of the spacing 505 between tiles 501A and 501B with the back-fill power 553 under the interfacial line 521.

Afterwards, the process chamber is optionally evacuated at step 533, depending on the electron beam welding technology chosen. At step 534, the sputtering target tiles and strips or powder of sputtering target material are pre-heated. In one embodiment, the pre-heating of the sputtering target tiles and the back-fill sputtering target material is accomplished by rastering de-focused electron beam across the surfaces of the sputtering target tiles to reach an average temperature greater than $0.4 T_m$ ($T_m$ is melting temperature), preferably greater than $0.5\ T_m$, and most preferably greater than $0.6\ T_m$, of the sputtering target material. Defocused electron beam reduces the intensity of the electron beam and also increases the surface area the electron beam touches. Using defocused electron beam to perform pre-heat allows using the existing electron beam welding equipment without adding additional heating devices.

At step 535, electron beam (focused) is provided to interfaces between the sputtering target tiles to weld the sputtering target tiles together. For example, two molybdenum tiles dimensions of 2805 mm×835 mm×10 mm (thick) are placed roughly 0.05 mm apart. Approximately 8 mm wide by 4 mm thick Mo strip is placed under the interfacial line. The electron beam tool is made by Sciaky of Chicago, Ill. and the electron welding system is made by Stadco of Los Angeles, Calif. The result shows that the modified process welds the gap from bottom to top without leaving a dips or gaps. The width of the weld "band" is about 3-3.5 mm wide.

Figure 5J:
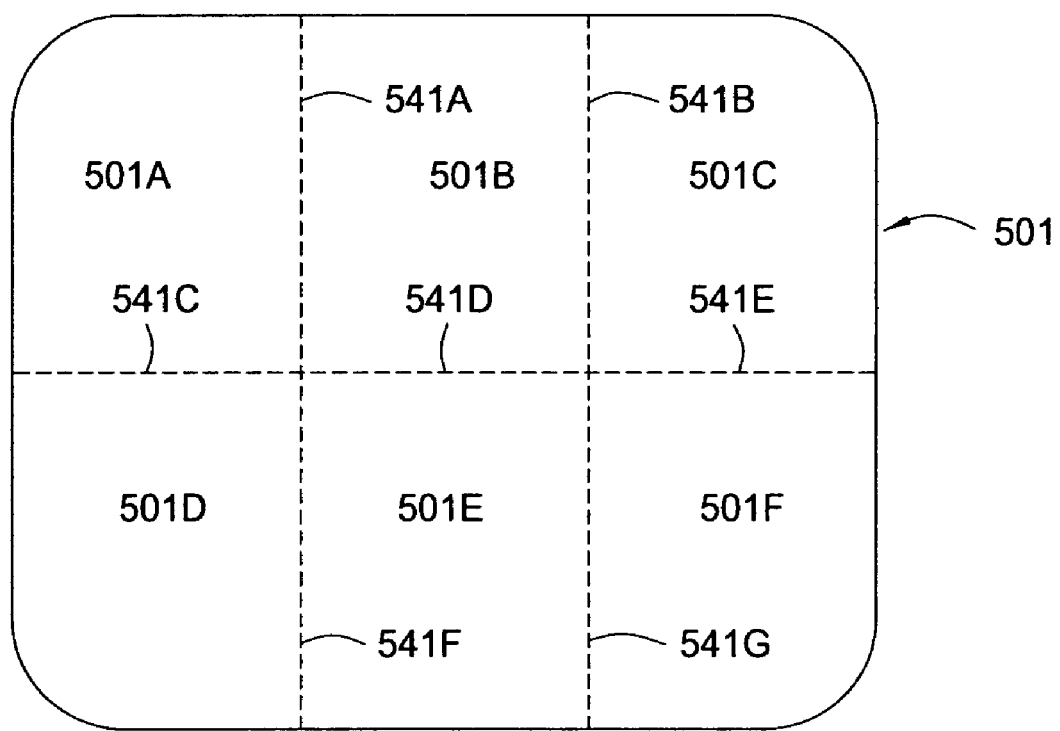
FIG. 5J shows a plan view of six sputtering target tiles welded to form a large sputtering target.

FIG. 5J shows a schematic drawing of six sputtering target tiles, 501A, 501B, 501C, 501D, 501E, and 501F, welded together to form a single large sputtering target tiles 501. Between the sputtering target tiles, 501A, 501B, 501C, 501D, 501E, and 501F, there are interfacial welding bands, 541A, 541B, 541C, 541D, 541E, 541F, and 541G. SEM cross-section of the welded section shows that the material in the heat-affected and weld zones is recrystallized. Larger grains are observed in the weld zone and heat affected zone (HAZ). Since sputtering material in the weld bands is recrystallized, the sputtering properties could be slightly different from the rest of the sputtering target. However, since the weld band widths are relatively small compared to the sizes of the sputtering target tiles, the impact is minimal. It is important to use strips or powder of sputtering target material with quality and purity that match the sputtering target tiles to control the quality sputtering target.

Figure 6A:
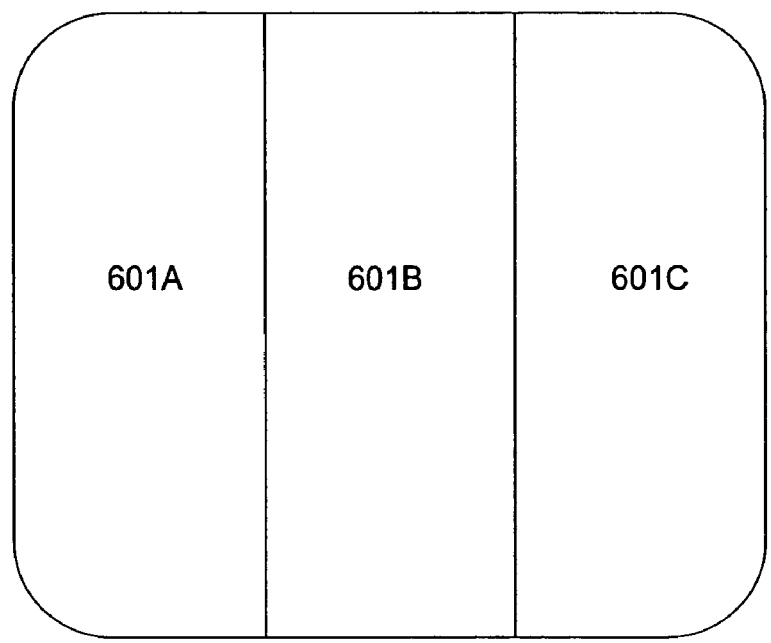
FIG. 6A is a plan view of one embodiment of the current invention with three sputtering target tiles placed side by side to be welded into a large sputtering target.
Figure 6B:
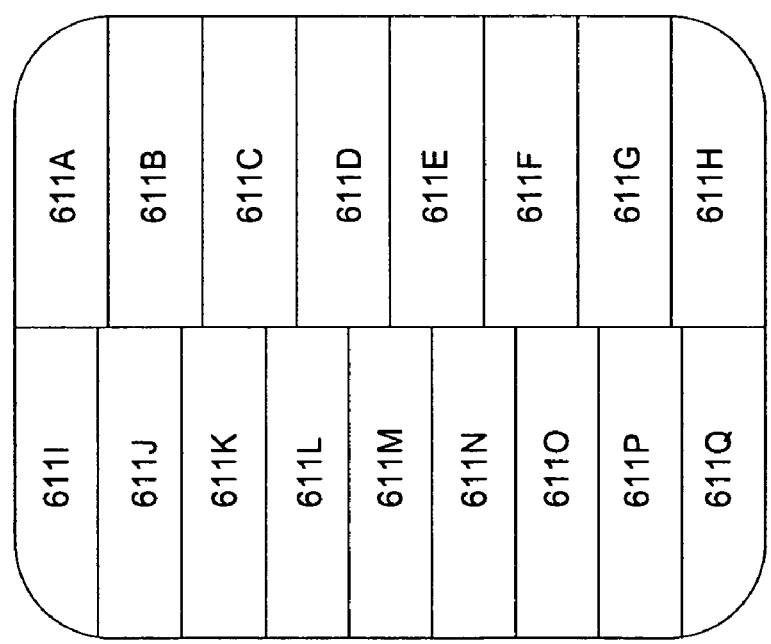
FIG. 6B is a plan view of one embodiment of the current invention with seventeen sputtering target tiles placed side by side to be welded into a large sputtering target.

Welding can also be applied to other arrangement of sputtering target tiles. FIG. 6A shows an embodiment of 3 sputtering target tiles, 601A, 601B, 601C, placed side by side to be welded into a large sputtering target. FIG. 6B shows another embodiment of 17 sputtering target tiles, 611A, 611B, 611C, 611D, 611E, 611F, 611G, 611H, 611I, 611J, 611K, 611L, 611M, 611N, 611O, 611P, 611Q, placed side by side to be welded into large sputtering target.

The concept of the invention can be applied to sputtering target for semiconductor wafer processing in PVD chambers. The concept of the invention can be applied to bond sputtering targets to manufacture flat panel displays, solar panels, or electronic devices.

While the foregoing is directed to embodiments of the present invention, other and further embodiments of the invention may be devised without departing from the basic scope thereof, and the scope thereof is determined by the claims that follow.

What is claimed is:

1. A method for welding sputtering target tiles, comprising:
    placing at least two sputtering target tiles side by side on a surface of support with edges of the at least two sputtering target tiles abutting and forming at least one interfacial line;
    placing strips or powder of sputtering target material under the at least one interfacial line between the at least two target tiles before welding the at least two sputtering target tiles; and
    welding the at least two sputtering target tiles placed side by side into a sputtering target.

2. The method of claim 1, wherein the gap spacing of the at least one interfacial line between the edges of the at least two sputtering target tiles is less than 0.5 mm.

3. The method of claim 1, wherein the gap spacing of the at least one interfacial line between the edges of the at least two sputtering target tiles is less than 0.05 mm.

4. The method of claim 1, wherein the welding is selected from the group consisting of electron beam welding, laser welding and friction stir welding.

5. The method of claim 1, further comprising:
    pre-heating the at least two sputtering target tiles and the strips or powder of sputtering target material placed under the at least one interfacial line between the at least two target tiles before welding to a pre-heat temperature less than the temperature at which target tiles begin to melt, undergo a change in physical state, or undergo substantial decomposition.

6. The method of claim 5, wherein the at least two sputtering target tiles and the strips or powder of sputtering target material placed under the at least one interfacial line between the at least two target tiles are pre-heated to at least one half of the melting temperature of the sputtering target material.

7. The method of claim 6, wherein the at least two sputtering target tiles and the strips or powder of sputtering target material placed under the at least one interfacial line between the at least two target tiles are pre-heated to at least three fifths of the melting temperature of the sputtering target material.

8. The method of claim 4, wherein the welding technique is electron beam welding and the welding is performed at a pressure less than $10^{-4}$ Torr.

9. The method of claim 1, wherein the sputtering target material is selected from the group consisting of aluminum, copper, gold, nickel, tin, molybdenum, chromium, zinc, palladium, stainless steel, palladium alloys, tin alloy, aluminum alloy, copper alloy, and indium tin oxide (ITO).

10. The method of claim 1, wherein the sputtering surface area of the sputtering target is greater than 10,000 cm$^2$.

11. A method for welding sputtering target tiles in an electron beam welding chamber, comprising:
    providing strips or powder of sputtering target material on a pre-determined at least one interfacial line between at least two sputtering target tiles on a surface of support;
    placing the at least two sputtering target tiles side by side with edges of the at least two sputtering target tiles abutting and forming at least one interfacial line on top of the strips or powder of sputtering target material;
    pumping out the gas in the electron beam welding chamber;
    preheating the at least two sputtering target tiles and the strips or powder of sputtering target material to a pre-heat temperature less than the temperature at which the at least two target tiles begin to melt, undergo a change in physical state, or undergo substantial decomposition; and
    welding the at least two sputtering target tiles placed side by side into a large sputtering target.

12. The method of claim 11, wherein the gap spacing of the pre-determined at least one interfacial line between the abutting edges of the at least two sputtering target tiles is less than 0.05 mm.

13. The method of claim 11, wherein the at least two sputtering target tiles and the strips or powder of sputtering target material placed under the pre-determined at least one interfacial line between the at least two target tiles are pre-heated to at least three fifths of the melting temperature of the sputtering target material.

14. The method of claim 11, wherein the welding is performed at a pressure less than $10^{-4}$ Torr.

15. The method of claim 11, wherein the sputtering target material is selected from the group consisting of aluminum, copper, gold, nickel, tin, molybdenum, chromium, zinc, palladium, stainless steel, palladium alloys, tin alloy, aluminum alloy, copper alloy, and indium tin oxide (ITO).

16. The method of claim 11, wherein the sputtering surface area of the sputtering target is greater than 750 cm$^2$.

* * * * *

UNITED STATES PATENT AND TRADEMARK OFFICE
CERTIFICATE OF CORRECTION

PATENT NO. : 7,652,223 B2
APPLICATION NO. : 11/245590
DATED : January 26, 2010
INVENTOR(S) : Tanase et al.

It is certified that error appears in the above-identified patent and that said Letters Patent is hereby corrected as shown below:

In the Detailed Description:

Column 8, Line 54, please delete "6111" and insert --611I-- therefor;

Column 8, Line 55, please delete "6110" and insert --611O-- therefor.

Signed and Sealed this

Sixth Day of April, 2010

David J. Kappos
*Director of the United States Patent and Trademark Office*